United States Patent [19]
Brown et al.

[11] Patent Number: 6,051,775
[45] Date of Patent: *Apr. 18, 2000

[54] DEVICE FOR TENSIONING SHEET MEMBERS

[75] Inventors: Michael A. Brown, Columbia; Brian Whalen, Silver Spring, both of Md.

[73] Assignee: The United States of America as represented by the Secretary of the Navy, Washington, D.C.

[ * ] Notice: This patent is subject to a terminal disclaimer.

[21] Appl. No.: 09/126,222

[22] Filed: Jul. 30, 1998

[51] Int. Cl.[7] .................................................. H01L 25/00
[52] U.S. Cl. .......................... 136/245; 136/246; 136/292
[58] Field of Search .................................. 136/245, 246, 136/292

[56] References Cited

U.S. PATENT DOCUMENTS 4,293,192  10/1981  Bronstein ................................. 359/846
4,532,169   7/1985  Carley ..................................... 428/109
5,885,367   3/1999  Brown et al. ........................... 136/245

*Primary Examiner*—Mark Chapman
*Attorney, Agent, or Firm*—Barry A. Edelberg; Charles J. Stockstill

[57] ABSTRACT

The device for tensioning sheet material applies a tensioning force around the outer edge of a sheet material to prevent the sheet material from wrinkling. These devices are attached to a supporting member forming the outer frame of a structure upon which the sheet material is to be attached and consist of tape strips or wires attached to or free sliding along the support member, sheet material of a differing material wrapped around the support member and attached to the main sheet material, with or without holes or slots, and extensions of the main sheet material around the support member, with or without heat created depressions along the border to relieve tearing stresses. Another tensioning member is a corner brace between perpendicular segments of the supporting member to remove wrinkles caused by manufacturing irregularities.

6 Claims, 5 Drawing Sheets

DEVICE FOR TENSIONING SHEET MEMBERS

BACKGROUND OF THE INVENTION

1. Field of the Invention

This invention pertains generally to tensioning devices and more particularly to a device for tensioning thin-sheet materials so as to prevent wrinkling.

2. Description of the Related Art

Solar power sources utilized in spacecraft may be comprised of the solar panels and reflectors in the form of a trough, the sun reflecting off the reflector panels onto the solar cells in the solar panel. In some applications, the power sources are stowed in a folded position during launching and unfolded after the satellite is established in orbit The reflectors must be flat in order to provide an even distribution of sunlight across the solar panel since any irregularities decrease the power output of the panel. In the prior art, flatness is achieved by using rigid reflectors which resulted in excessive mass for the system.

SUMMARY OF THE INVENTION

The object of this invention is to provide an apparatus for loading a thin-sheet material with tensioning forces that are perpendicular to the edge of the sheet, and equal in magnitude, around the entire border of the sheet.

This and other objectives are accomplished by a plurality of tensioning devices that apply a tensioning force around the outer edge of a sheet material to prevent the sheet material from wrinkling. These devices are attached to a supporting member forming the outer frame of a structure upon which the sheet material is to be attached and consist of tape strips or wires attached to or free sliding along the support member, sheet material of a differing material wrapped around the support member and attached to the main sheet material, with or without holes or slots, and extensions of the main sheet material around the support member, with or without heat created depressions along the border to relieve tearing stresses. Another tensioning member is a corner brace between perpendicular segments of the supporting member to remove wrinkles caused by manufacturing irregularities.

DESCRIPTION OF THE PREFERRED EMBODIMENT

Figure 1:
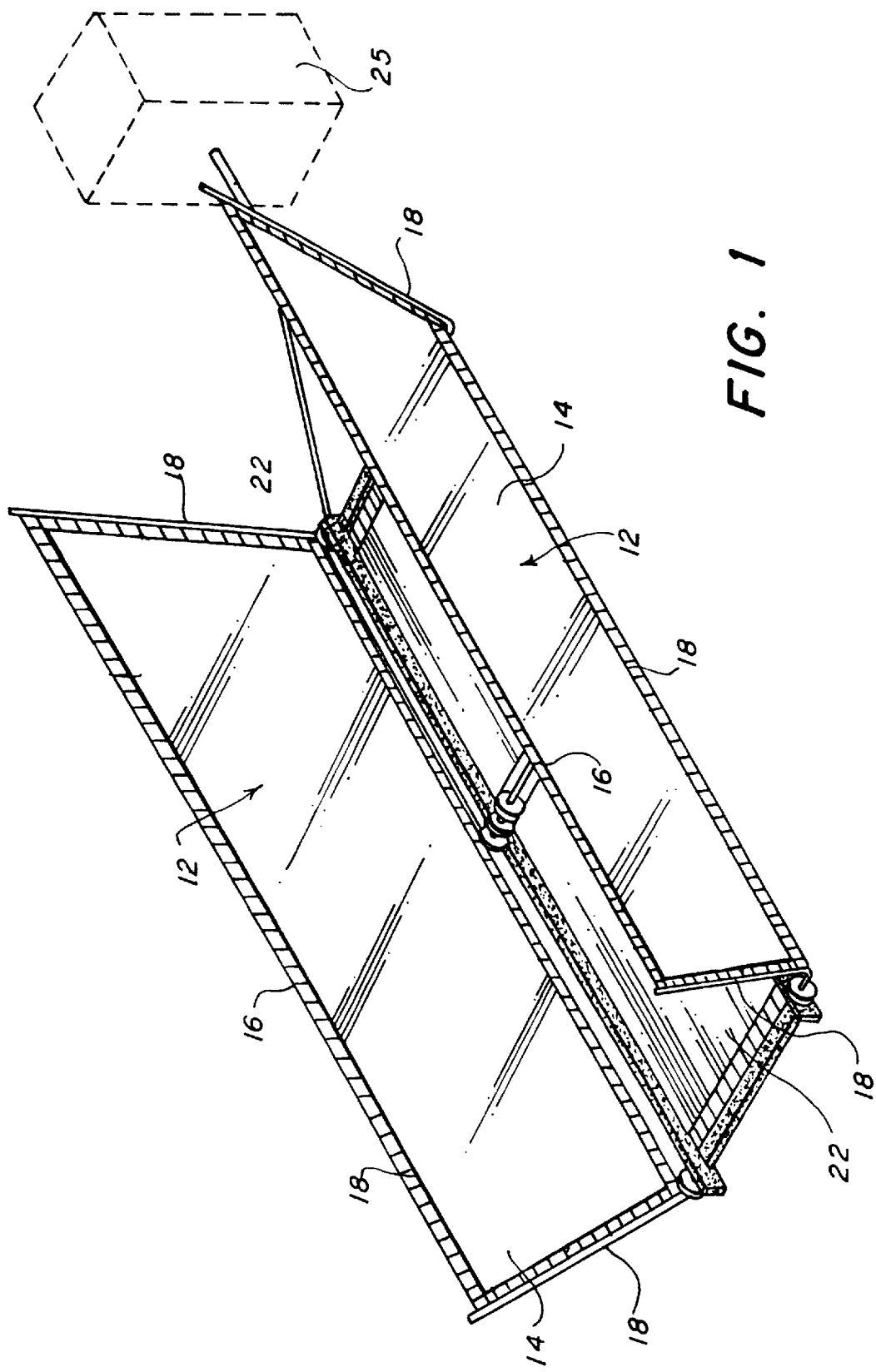
FIG. 1 shows a typical installation utilizing a technique for tensioning a sheet matrial.

In a typical design utilizing tensioning devices for preventing sheet material from wrinkling, a reflector 12, as shown in FIG. 1, comprised of a sheet of thin reflector material 14 is attached to a support member 16 between and along two perpendicular frame supports 17 forming the ends of a trough type solar reflector, comprised of catenary-like wires, by a tensioning member 18 to form a reflector. Such an exemplary device is used to reflect solar rays onto an array of solar cells 22 to generate electrical power for a satellite 25.

Figure 2A:
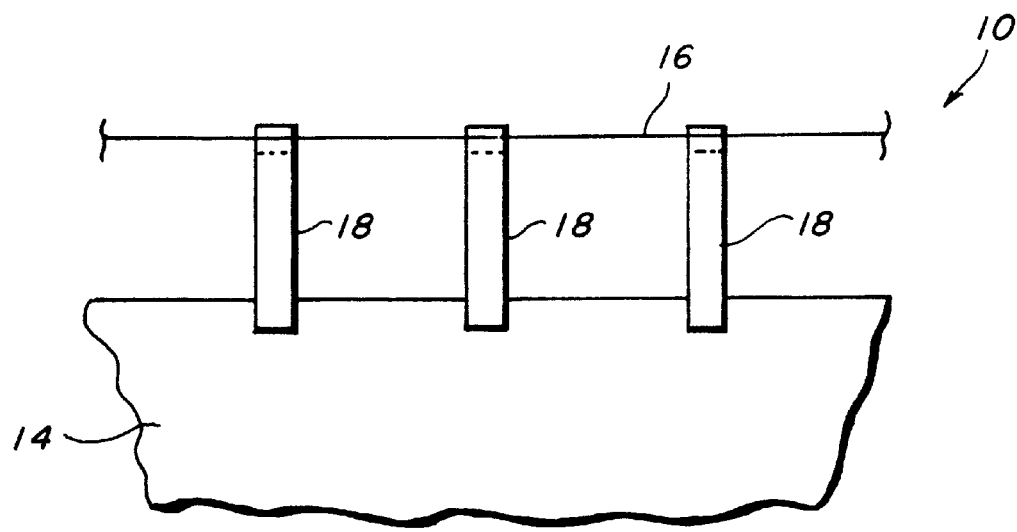
FIG. 2a shows a tensioning device utilizing tape material.

In a preferred embodiment 10, as shown in FIG. 2a, a sheet of material 14 made of a polymide with a high coefficient of thermal expansion (CTE), and cut in a catenary or parabolic shape, is attached to a support member 16 made of either Kelvar® or aluminum wire with discrete links such as tape that forms a tensioning member 17. The support member 16, having a lower CTE, allows relative thermal expansion motion between the support member 16 and the sheet material 14, when they are constructed from materials having differing CTE's. The tape, made of Kaptor®, forming the tensioning member 18 is fixed to the support member 16 and reflective sheet material with a glue, such as a phenolic adhesive, made by Fralock 818,709 or 1288. The tensioning members 18 are placed at preselected points along the support member 16.

Figure 2B:
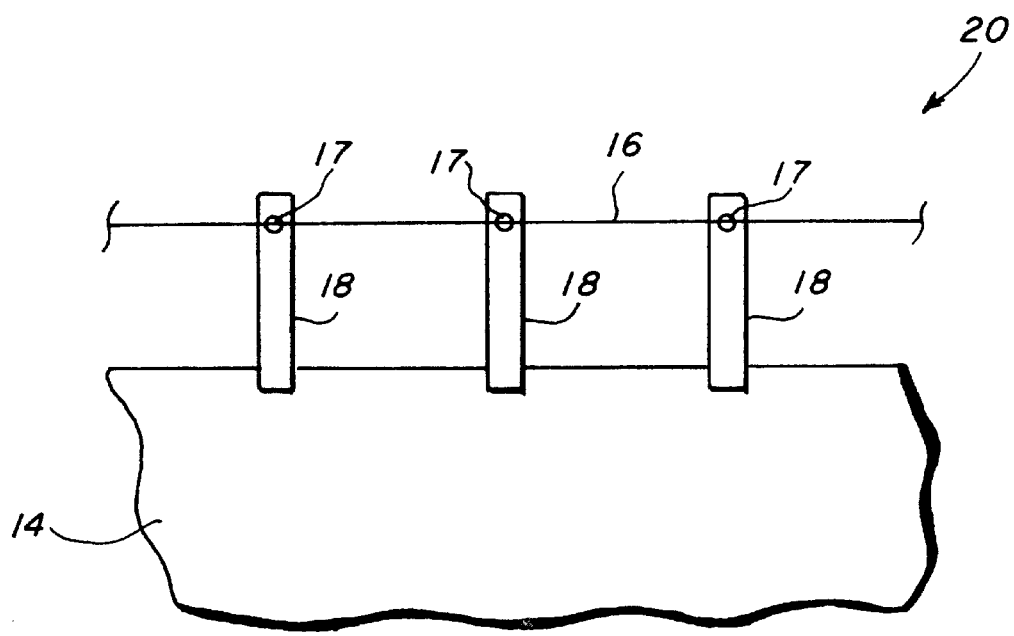
FIG. 2b shows a tensioning device utilizing tape material with grommets attaching the material to a support member.

In another preferred embodiment 20, as shown in FIG. 2b, tape, as described above, forming a tensioning member 18 is bonded to the edge of the reflector material 14 with a glue as described above, and free to slip along a wire forming the supporting member 16 on a grommet 17 inserted into the material forming the tensioning member 18. The grommet 17 is preferably made of a plastic material.

Figure 2C:
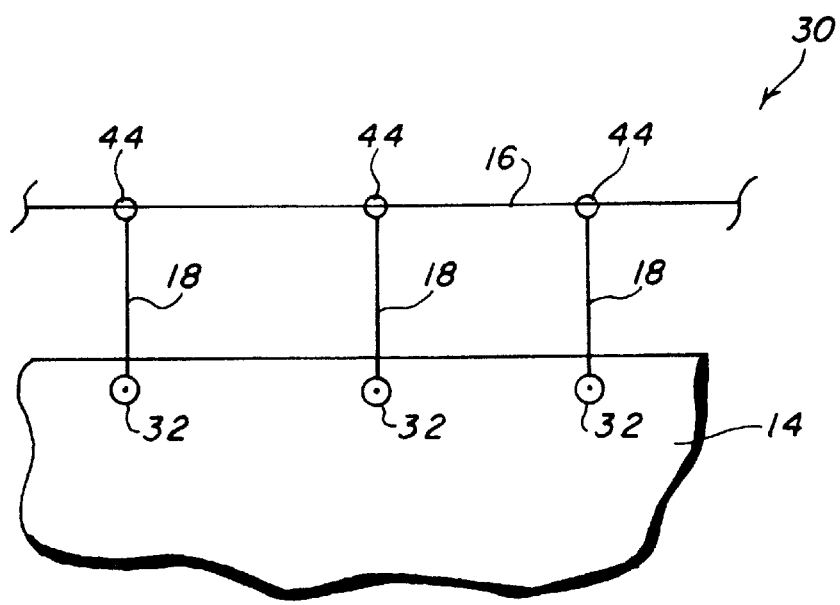
FIG. 2c shows a wire tensioning device with loops around the support member and attached to a reflective material with grommets.

In another preferred embodiment 30, as shown in FIG. 2c, the tensioning member 18 is a wire, preferably Kevlar®, or a similar material, that is free to rotate in a washer 32 attached to the reflector sheet material 14 and a loop 44 that is free to slip along the supporting member 16. The washer 32 preferably is of a plastic material, however any other similar material or metal may be used.

Figure 2D:
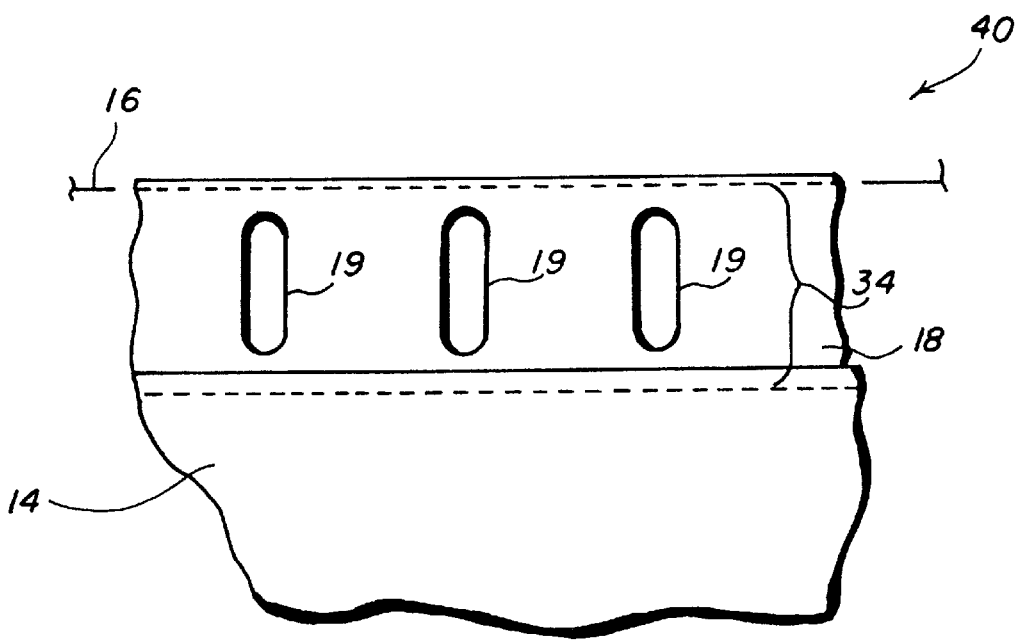
FIG. 2d shows a tensioning member with a border of continuous, flexible material, having holes or slots of a predetermined dimension punched or cut therein, that is bonded to both the supporting member and the reflective sheet material.

In another preferred embodiment 40, as shown in FIG. 2d, a reflective sheet material 14 may also be joined to the supporting member 16 with a border 34 of continuous, flexible material, having holes or slots 19 of a predetermined dimension punched or cut therein, that is bonded to both the supporting member 16 and the reflective sheet material 14 with a glue as previously described. This design provides a means to absorb strains in the supporting member 16 so they are not transferred to the reflective sheet material 14. This border material may be the same material as that found in the reflective sheet 14.

All of the foregoing embodiments 10 through 40 the tensioning members are called compliant borders in that they prevent strain in the supporting member 16 from being transferred to the reflective sheet material 14, and allow the supporting member 16 and sheet 14 to expand and contract relative to each other without wrinkling the sheet 14. To avoid severing of the supporting member 16 by micrometeorites, the tensioning device 16 and a wire 36 joining the corners of the reflectors 12 to a boom 38, may be made of a braided cable, of several cables separated by a spacer, or of solid elements such as strips of metal or tubes.

Figure 3A:
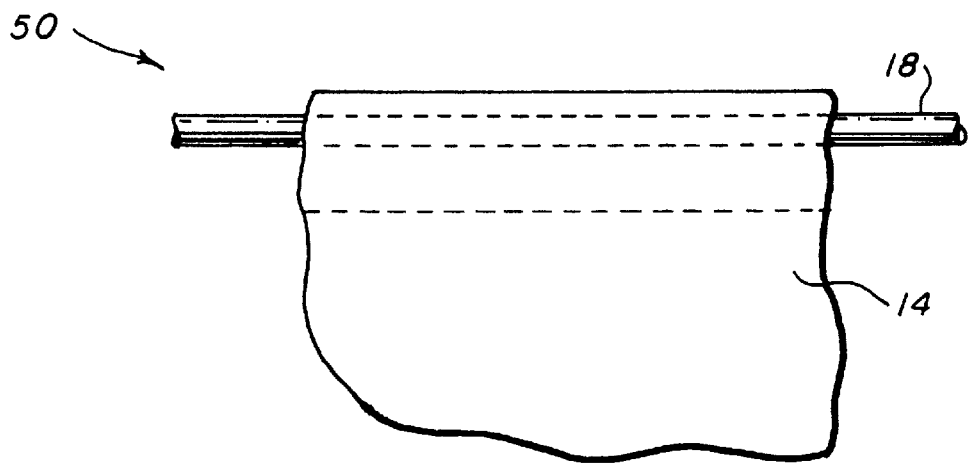
FIG. 3a shows a tensioning member integral with the reflector sheet material.

In another preferred embodiment 50, as shown in FIG. 3a, shows a tensioning member 18 integral with the reflector sheet material 14. In this embodiment 50, the tensioning member 18 has a CTE closer to that of the reflector sheet material 14. This may be a plastic tubing bonded to the reflector material 14, or strips of reflector material 14 bonded together, to a preferred thickness of 0.005 inches, and then bonded to the reflector sheet material 14. The bonding agent preferably is a glue of the type described above.

Figure 3B:
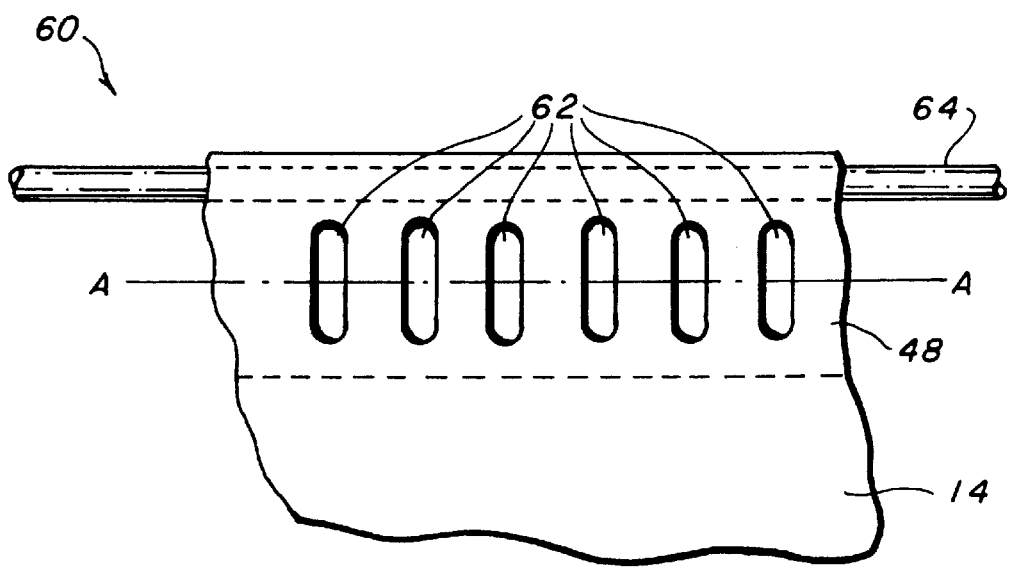
FIG. 3b shows a tensioning member with a compliant border created by heating and deforming the parallel tensioning strips of reflector material so that a number of thin, parallel tensioning strips link the tensioning border and the active part of the solar panels.
Figure 3C:
FIG. 3c shows a cross-section A—A of FIG. 3b.

In another preferred embodiment 60, as shown in FIG. 3b, to decrease the danger of wrinkling at the edge of the reflective material 14, a compliant border 48 is created by heating and deforming selective portions of the strip of reflective material 14 so that a number of thin, parallel tensioning strips 62 link the compliant border 48 and the active part of the reflective material 14, as shown in FIG. 3c. The parallel tensioning strips 62 being comprised of a plurality of heat deformed depressions formed in the sheet material 14 by a heat process well known to those skilled in the art. The reflective material 14 is wrapped around a member made of layers of the thin strips of reflective material (approximately 0.0005 inches thick) to a thickness of 0.005 inches glued together, as discussed above, or the reflective material 14 may be rolled to form a circular support member 64 and glued together between layers, as described previously. The reflective material 14 is precut to a catenary or parabolic shape prior to assembly and maintained in that configuration, without wrinkles, by the stresses set up in the material by the support member 64.

Figure 4:
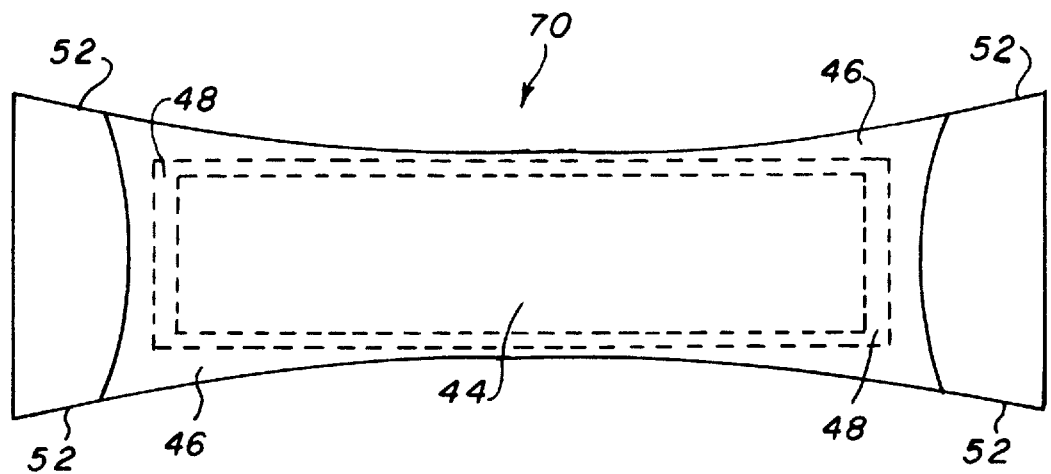
FIG. 4 shows a one-piece solar panel made by casting a plastic material so that it has a thickened border for tensioning and an area of intermediate thickness between the border and active reflector comprised of reflector sheet material for perforations for compliance.

In another preferred embodiment, as shown in FIG. 4, a one-piece solar panel 70 is made by casting a plastic material so that it has a thickened border 46 for tensioning and an area of intermediate thickness 48 between the border and active reflector comprised of reflector sheet material 44 for perforations for compliance. The edge support members 52 have curves that are either parabolic or a constant radius, and while they are generally referred to as "catenary-like", they are not true catenaries. Parabolic curves are used where the links between the supporting member 52 and the reflector sheet material 44 are fixed at either end, while constant radius curves can be used where the joining member is free to slip along the supporting member 16.

Figure 5:
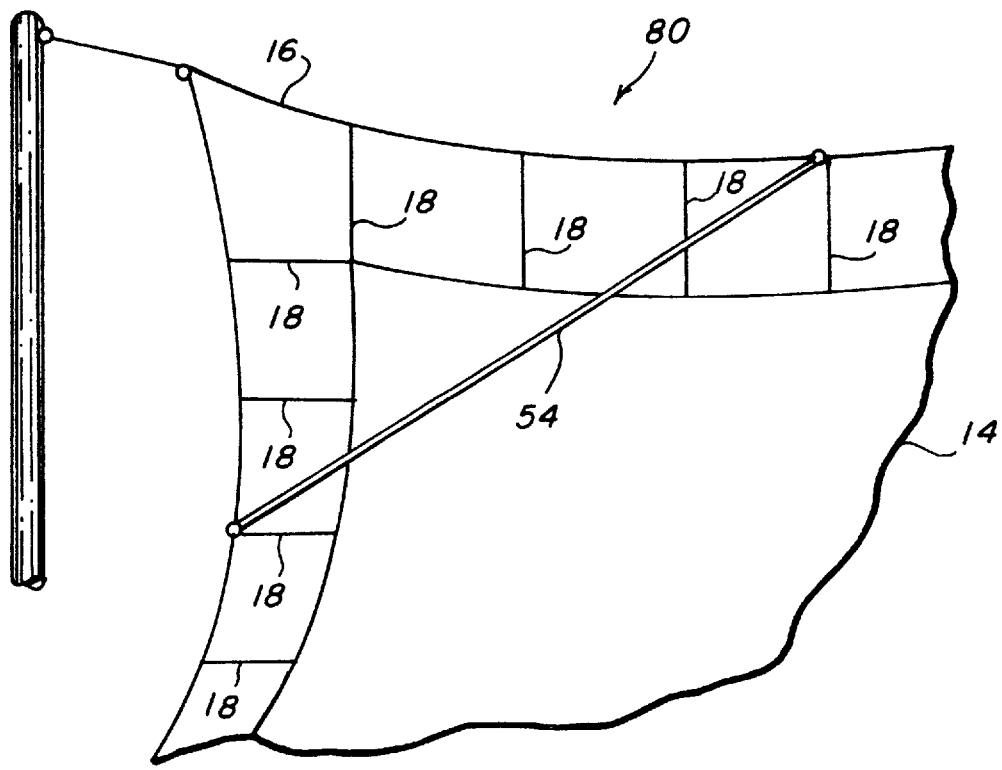
FIG. 5 shows a tensioning member comprised of corner braces used in the region where two supporting members meet, to eliminate wrinkling.

In another preferred embodiment 80, as shown in FIG. 5, corner braces 54 may be used in the region where two supporting members 16 meet, to eliminate wrinkling in this region caused by manufacturing imperfections. The braces 54 are rigid rods that link two adjacent edge supporting members 16, outside the area of active reflector, to prevent wrinkling in the corners of the reflector sheet material 14. These braces are preferably made of graphite epoxy.

Although this invention has been described in relation to exemplary embodiments directed to application in a spacecraft environment, it is equally applicable to other applications where it is desirable to tension flexible sheets of material so as to prevent wrinkling of the sheet material, therefore, it will be understood by those skilled in the art that other variations and modifications can be affected in the preferred embodiments without detracting from the scope of the invention as set forth in the claims.

What is claimed:

1. A device for removing wrinkles from a sheet material of a solar reflector panel forming a trough solar reflector, comprising:
   a support member having a low coefficient of thermal expansion than a coefficient of thermal expansion of the sheet material;
   said sheet material having a parabolic shape;
   a predetermined length of tape forming a tensioning member between and along two perpendicular supporting members of the trough solar reflector structure; and
   said tape being attached to said support member at predetermined intervals along the support member on a first end attached to the sheet material at a second end.

2. A device for removing wrinkles from a sheet material of a solar reflector panel forming a trough solar reflector, comprising:
   a support member having a lower coefficient of thermal expansion than a coefficient of expansion of the sheet material;
   a predetermined length of tape forming a tensioning member between and along two perpendicular supporting members of the trough solar reflector structure; and
   said tape being attached to said support member at predetermined intervals along the support member on a first end in such a manner that the tape may slide along the support member and attached to the sheet material at a second end.

3. A device for removing wrinkles from a sheet material of a solar reflector panel forming a trough solar reflector, comprising:
   a support member;
   a predetermined length of wire forming a tensioning member between and along two perpendicular supporting members of the trough solar reflector structure; and
   said wire being attached to said support member at predetermined intervals along the support member on a first end in such a manner that the wire may slide along the support member and attached to the sheet material at a second end with a grommet.

4. A device for removing wrinkles from a sheet material of a solar reflector panel forming a trough solar reflector, comprising:
   a support member having a lower coefficient of thermal expansion than a coefficient of expansion of the sheet material;
   a border of tape material around the sheet material of forming a tensioning member between and along two perpendicular supporting members of the trough solar reflector structure;
   said tape material being attached to said support member along the entire length and attached to the sheet material at a second end; and
   said tape material, having slots at predetermined points along its entire length.

5. A device for removing wrinkles from a sheet material of a solar reflector panel forming a trough solar reflector, comprising:
   a support member comprised of layers of thinly cut sheet material;
   said sheet material having parabolically formed edges;
   said edges of the sheet material wrapped around the support member at a first end forming a tension member and attached to the sheet material at a second end forming a compliant border of tensioning strip material; and heat induced depressions in the compliant border created by heating and deforming the tensioning strip material so that a plurality of thin, parallel tensioning strips link the support member to the sheet material.

6. A device for removing wrinkles from sheet material of a solar reflector panel forming a trough solar reflector, comprising:

a wire support member forming a square around a rectangular sheet of material of a solar reflector panel forming a trough solar reflector and connected to the sheet material by tensioning members placed at predetermined positions along the support member;

said sheet material having a catenary shape; and rigid rods forming a corner brace placed at each corner of the square where two supporting members meet, to eliminate wrinkling.

* * * * *